US008159231B2

(12) United States Patent
Sakamaki

(10) Patent No.: US 8,159,231 B2
(45) Date of Patent: Apr. 17, 2012

(54) METHOD FOR MANUFACTURING A SENSOR SUPPORTING MEMBER

(75) Inventor: Ryousuke Sakamaki, Kosai (JP)

(73) Assignee: ASMO Co. Ltd., Shizuoka-ken (JP)

( * ) Notice: Subject to any disclaimer, the term of this patent is extended or adjusted under 35 U.S.C. 154(b) by 378 days.

(21) Appl. No.: 12/473,683

(22) Filed: May 28, 2009

(65) Prior Publication Data

US 2009/0295410 A1 Dec. 3, 2009

(30) Foreign Application Priority Data

May 29, 2008 (JP) ................................ 2008-141472

(51) Int. Cl.
*G01R 27/26* (2006.01)

(52) U.S. Cl. ...................... 324/663; 340/545.1; 340/540

(58) Field of Classification Search ................ 296/146.4
See application file for complete search history.

(56) References Cited

U.S. PATENT DOCUMENTS 5,728,983 A * 3/1998 Ishihara et al. ............ 200/61.43
6,107,580 A * 8/2000 Hoshikawa et al. ....... 200/61.43
6,339,305 B1 * 1/2002 Ishihara et al. ............... 318/445
6,739,198 B2 * 5/2004 Suzuki et al. .................. 73/753
6,912,912 B2 * 7/2005 Reichinger et al. ............ 73/800
7,055,885 B2 * 6/2006 Ishihara et al. ........... 296/146.4
7,534,957 B2 * 5/2009 Yamaura et al. ................ 174/36
7,714,595 B2 * 5/2010 Fujiwara et al. ............. 324/663
7,893,831 B2 * 2/2011 Hoshina et al. ........... 340/545.1

FOREIGN PATENT DOCUMENTS

JP 2006-300924 11/2006
JP 20066-300924 * 11/2006

* cited by examiner

*Primary Examiner* — Richard Isla Rodas

(74) *Attorney, Agent, or Firm* — Pearl Cohen Zedek Latzer, LLP

(57) ABSTRACT

An opening and closing apparatus is disclosed. The opening and closing apparatus includes an opening and closing body, a capacitance sensor, and a sensor support member. The dynamic capacitance sensor has a conductive sensor electrode, and outputs a detection signal that corresponds to the capacitance between the sensor electrode and a conductive object located close to the sensor electrode. The sensor support member includes a guard electrode, a holding portion, an attaching portion, and a conductive reinforcing member. The reinforcing member is embedded in the main body. At least a part of the reinforcing member is embedded in the guard electrode such that the reinforcing member is integrated with the guard electrode.

2 Claims, 10 Drawing Sheets

METHOD FOR MANUFACTURING A SENSOR SUPPORTING MEMBER

CROSS-REFERENCE TO RELATED APPLICATIONS

This application claims priority from Japanese application 2008-141472, filed on May 29, 2008, incorporated by reference herein in its entirety.

FIELD OF THE INVENTION

The present invention relates to an opening and closing apparatus that opens and closes an opening with an opening and closing body actuated by drive force, for example, of a motor, and to a method for manufacturing a sensor supporting member for fixing a capacitance sensor that detects whether an object exists between the opening and closing body and the edge of the door opening.

BACKGROUND OF THE INVENTION

Conventionally, some vehicles such as automobiles are equipped with a power sliding door apparatus (opening and closing apparatus), which opens and closes a door opening on a side on a side with a door panel (an opening and closing body) slid by drive force, for example, of a motor. Such a power sliding door apparatus has a function for preventing an object from being caught between the door panel and the edge of the door opening.

For example, Japanese Laid-Open Patent Publication No. 2006-300924 discloses a power sliding door apparatus that includes a capacitance sensor (sensor body) with a sensor electrode. The capacitance sensor is fixed to the front end of the door panel with a sensor support member. The capacitance sensor is electrically connected to a capacitance detector. The capacitance detector detects changes in the capacitance of the capacitance sensor using the sensor electrode. In this power sliding door apparatus, changes of the capacitance of the capacitance sensor is detected by using the sensor electrode. When an object it is detected that an object is close to the front end of the door panel based on the detected capacitance changes, the motor is controlled to stop the sliding of the door panel.

Changes in the capacitance of the capacitance sensor detected by using the sensor electrode is subtle when an object has approached the front end of the door panel. Therefore, when the capacitance of the capacitance sensor detected by using the sensor electrode is changed due to disturbance, the existence of an object can be erroneously detected. Factors of disturbance include changes in the stray capacity caused by wiring in the vehicle, changes in the impedance of the door panel, and changes in the electrical potential of the door panel caused by electrification. Therefore, to prevent erroneous detection caused by disturbance, the sensor support member of the power sliding door apparatus of the above publication includes a guard electrode, which is maintained at the same voltage as the sensor electrode. The guard electrode is made of conductive resin material, and is integrally formed with insulating resin material forming the sensor support member. The guard electrode is in contact with a reinforcing member that is made of a conductive metal plate embedded in the insulating resin material.

Although the above publication describes that the sensor support member is formed by extrusion molding, no specific method for manufacturing is disclosed. When manufacturing the sensor support member having the guard electrode by the extrusion molding, two different resin materials, which are insulating resin material and conductive resin material, need to be integrated and formed into desired shapes. This is expected to complicate the manufacture of the sensor support member. Thus, there is a demand for a method that facilitates the manufacture of sensor support members.

SUMMARY OF THE INVENTION

Accordingly, it is an objective of the present invention to provide an opening and closing apparatus having a sensor support member, which has a guard electrode made of a conductive resin material and is easy to manufacture, and a method for manufacturing the sensor support member.

To achieve the foregoing objective and in accordance with a first aspect of the present invention, an opening and closing apparatus including an opening and closing body, a drive portion, a capacitance sensor, a sensor support member, and a detection section is provided. The opening and closing body is used for opening and closing an opening formed in an opened and closed body. The drive portion actuates the opening and closing body. The capacitance sensor has a conductive sensor electrode, and outputs a detection signal that corresponds to the capacitance between the sensor electrode and a conductive object located close to the sensor electrode. The sensor support member fixes the capacitance sensor either to a closing end of the opening and closing body that is on the leading side when the opening and closing body is being closed or to an edge of the opening. The sensor support member includes a guard electrode, a holding portion, an attaching portion, and a conductive reinforcing member. The guard electrode is made of conductive resin material. The voltage of the guard electrode is maintained either at the same level as the voltage of the sensor electrode or at a level of a constant ratio relative to the voltage of the sensor electrode. The holding portion holds the capacitance sensor. The attaching portion has a main body made of insulating resin material, and fixes the holding portion either to the closing end or to the edge of the opening. The conductive reinforcing member is embedded in the main body. At least a part of the reinforcing member is embedded in the guard electrode such that the reinforcing member is integrated with the guard electrode. The detecting section detects the object located close to the capacitance sensor based on the detection signal output from the capacitance sensor.

In accordance with a second aspect of the present invention, a method for manufacturing a sensor support member is provided. The sensor support member fixes a capacitance sensor, which detects a conductive object existing between an opening and closing body actuated by a drive portion and an edge of an opening, either to a closing end of the opening and closing body that is on the leading side when the opening and closing body is being closed or to the edge of the opening. The capacitance sensor includes a conductive sensor electrode, and outputs a detection signal that corresponds to the capacitance between the sensor electrode and a conductive object located close to the sensor electrode. The sensor support member includes a guard electrode made of conductive resin material. The voltage of the guard electrode is maintained either at the same level as the voltage of the sensor electrode or at a level of a constant ratio relative to the voltage of the sensor electrode. The manufacturing method includes: embedding at least a part of a conductive reinforcing member in the guard electrode, thereby integrating the reinforcing member with the guard electrode; and embedding the reinforcing member in insulating resin material that forms the sensor support member.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE PREFERRED EMBODIMENT

Hereinafter, a preferred embodiment according to the present invention will be described.

Figure 1:
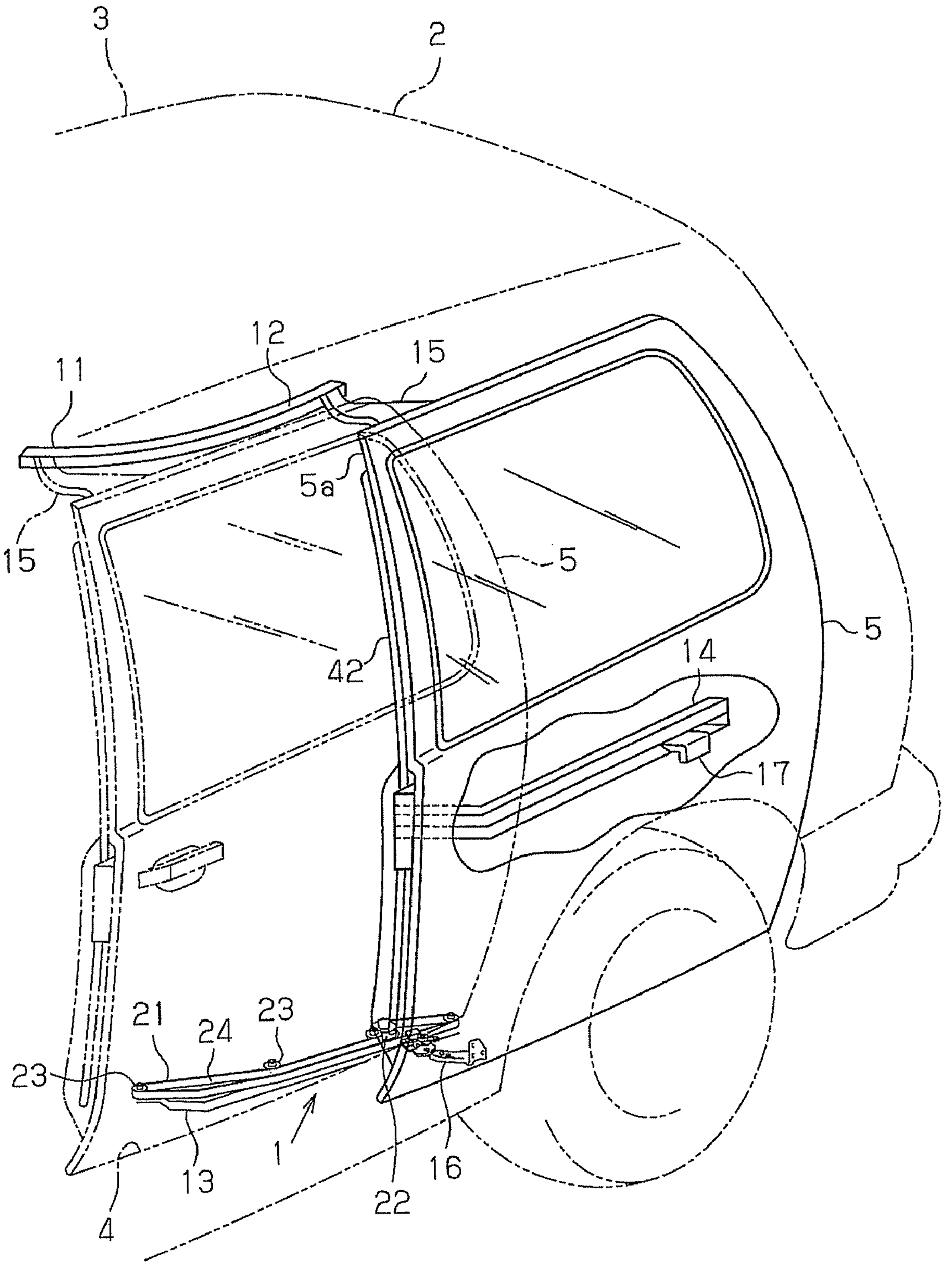
FIG. 1 is a perspective view illustrating a vehicle equipped with a power sliding door apparatus according to one embodiment of the present invention.

FIG. 1 illustrates a vehicle 2 equipped with an opening and closing apparatus, which is a power sliding door apparatus 1. As shown in FIG. 1, the vehicle 2 includes an opened and closed body made of a conductive metal material, which is a vehicle body 3. A rectangular opening, which is a door opening 4, is formed in the left side of the vehicle body 3. The door opening 4 is opened and closed with a rear door panel 5 (opening and closing body) formed of conductive metal material. The rear door panel 5 has a rectangular shape in accordance with the shape of the door opening 4.

The rear door panel 5 is attached to the vehicle body 3 with a drive portion, which is an actuating mechanism 11, so as to be movable substantially in the front-rear direction relative to the vehicle body 3. A lock mechanism (not shown), for example, a latch is provided in the rear door panel 5. The lock mechanism immovably locks the rear door panel 5 with respect to the vehicle body 3 when the rear door panel 5 closes the door opening 4, that is, when the rear door panel 5 is at the fully closed position. A half latch detecting portion (not shown), which is composed, for example, of a limit switch, is provided in the vicinity of the lock mechanism. The half latch detecting portion outputs a half latch detection signal to a control circuit device 91 (see FIG. 2) of the power sliding door apparatus 1 if the lock mechanism is in a half latched state.

The actuating mechanism 11 is composed of an upper rail 12, a lower rail 13, and a center rail 14 provided in the vehicle body 3, and an upper arm 15, a lower arm 16, and a center arm 17 provided in the rear door panel 5.

The upper rail 12 and the lower rail 13 are respectively provided in an upper portion and a lower portion of the door opening 4 in the vehicle 2, and extend along front-rear direction of the vehicle 2. The center rail 14 is provided in a substantially center in the up-down direction of a part rearward of the door opening 4 in the vehicle 2, and extends along the front-rear direction of the vehicle 2. Each of the rails 12 to 14 is formed in such a manner as to extend linearly along the front-rear direction of the vehicle 2. A front end of each of the rails 12 to 14 is curved toward the interior of the passenger compartment.

The arms 15 to 17 are respectively fixed to positions of an upper portion, a lower portion, and a center portion in a side surface facing the interior of the passenger compartment of the rear door panel 5. The upper arm 15 is coupled to the upper rail 12. The lower arm 16 is coupled to the lower rail 13. The center arm 17 is coupled to the center rail 14. The arms 15 to 17 are respectively guided by the rails 12 to 14 so as to be movable along the front-rear direction of the vehicle 2.

Figure 2:
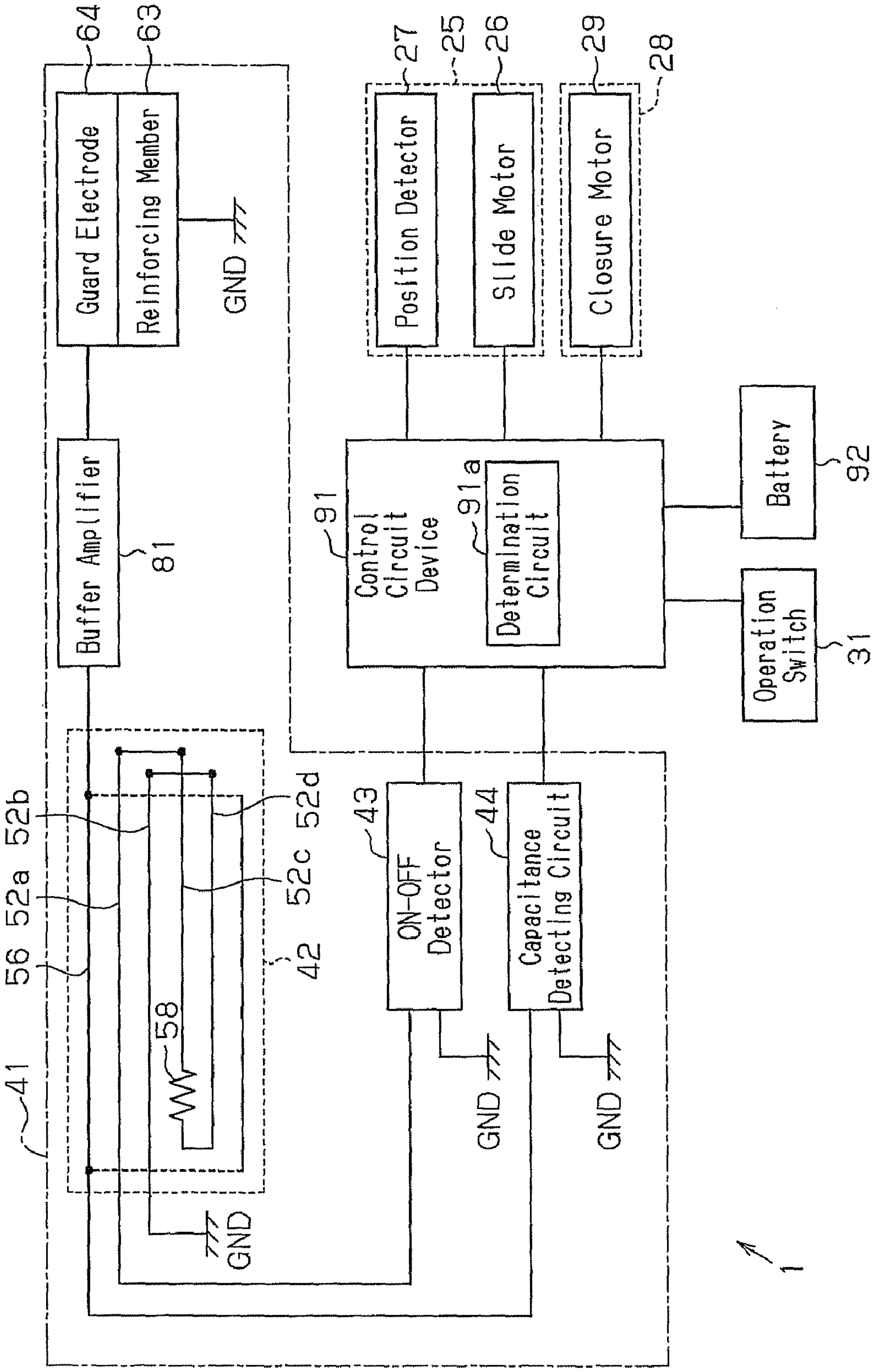
FIG. 2 is an electrical configuration of the power sliding door apparatus of FIG. 1.

The lower arm 16 is moved forward and rearward by a drive mechanism 21. More specifically, the drive mechanism 21 includes a drive pulley 22 and a plurality of driven pulleys 23 at positions closer to the passenger compartment than the lower rail 13. The pulleys 22, 23 are each rotatable about a shaft extending in the up-down direction of the vehicle 2. An endless belt 24 is wound around the drive pulley 22 and the driven pulleys 23. A distal end portion of the lower arm 16 is fixed to the endless belt 24. As shown in FIGS. 1 and 2, the drive mechanism 21 includes a slide actuator 25 connected to the drive pulley 22. The slide actuator 25 is located in the passenger compartment. The slide actuator 25 is provided with a slide motor 26 and a transmission mechanism (not shown), which reduces the speed of rotation of the slide motor 26 and transmits the rotation to the drive pulley 22. When the slide motor 26 is driven, the drive pulley 22 is rotated. Then, the endless belt 24 is rotated to move the lower arm forward and rearward. The rear door panel 5 is thus slid forward and rearward.

A position detector 27 for detecting rotation of the slide motor 26 is located in the slide actuator 25. The position detector 27 includes, for example, a permanent magnet and a Hall IC (not shown). The permanent magnet rotates integrally with the rotary shaft (not shown) of the slide motor 26 or with the reducing gear (not shown) of the speed reducing mechanism, and the Hall IC is arranged to face the permanent magnet. The Hall IC outputs, as position detection signals, pulse signals in accordance with changes in the magnetic field of the permanent magnet caused by rotation of the permanent magnet.

The drive mechanism 21 includes a closure actuator 28 located in the rear door panel 5. The closure actuator 28 is provided with a closure motor 29 and a speed reducing mechanism (not shown), which reduces the speed of rotation of the closure motor 29. When the closure motor 29 is driven, the rear door panel 5 is moved to a position where the rear door panel 5 is lockable by the lock mechanism.

The power sliding door apparatus 1 also includes an operation switch 31 electrically connected to the control circuit device 91. When an occupant of the vehicle 2 operates the operation switch 31 to open the door opening 4, the operation switch 31 outputs to the control circuit device 91 an open signal, which is a command for sliding the rear door panel 5 so as to open the door opening 4. On the other hand, when the occupant of the vehicle 2 operates the operation switch 31 to close the door opening 4, the operation switch 31 outputs to the control circuit device 91 a close signal, which is a command for sliding the rear door panel 5 so as to close the door opening 4. The operation switch 31 is provided in a predetermined portion (for example, in the dashboard) within the passenger compartment, on a side of the rear door panel 5 inside the passenger compartment, or in a portable item (not shown) carried together with the ignition key.

The power sliding door apparatus 1 has an object detecting section 41 (detecting section) for detecting an object that is close to or contacts a front end 5*a* of the rear door panel 5. The object detecting section 41 includes a sensor portion 42 (capacitance sensor), an ON-OFF detector 43, and a capacitance detecting circuit 44.

Figure 3A:
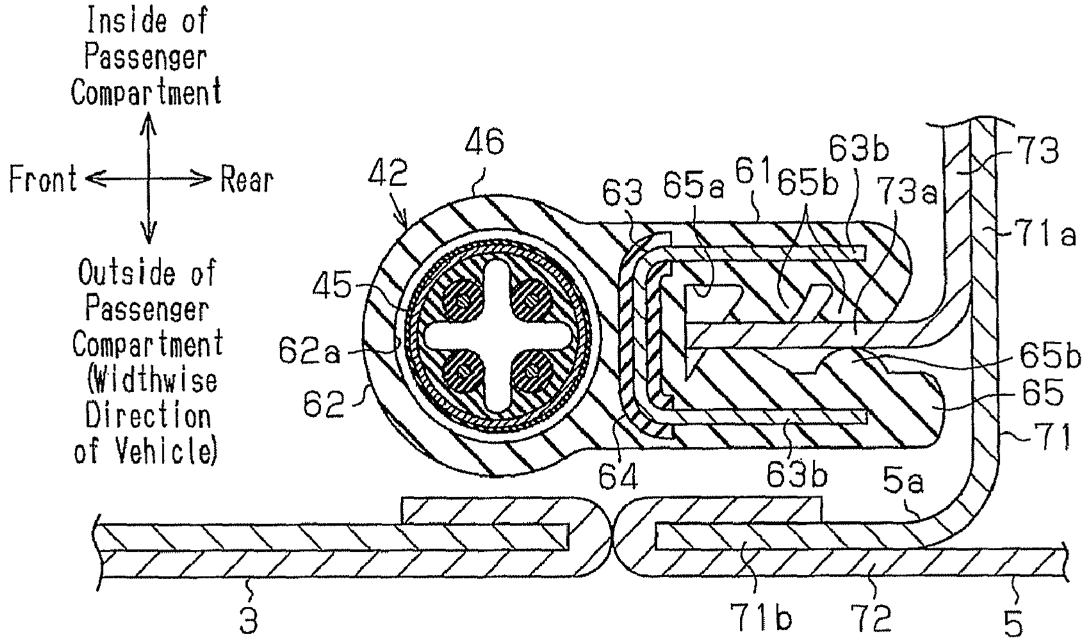
FIG. 3A is a partial cross-sectional view of the vehicle shown in FIG. 1.

The sensor portion 42 is provided along the leading end of the rear door panel 5 when the rear door panel 5 is being closed, that is, along the front end 5*a* of the rear door panel 5. As shown in FIG. 3A, the sensor portion 42 includes a cable-like sensor body 45 and a sensor support member 46 for fixing the sensor body 45 to the door panel 5.

Figure 3B:
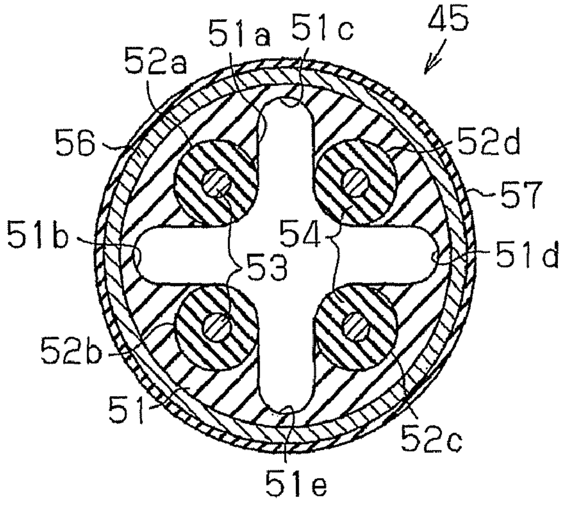
FIGS. 3B and 3C are cross-sectional views illustrating the sensor body of the power sliding door apparatus shown in FIG. 1.

As shown in FIG. 3B, the sensor body 45 has an elongated shape. An insulating layer 51 is proved at a center portion of the sensor body 45. The insulating layer 51 is substantially cylindrical. The insulating layer 51 is formed of insulating material that has insulation properties and restoring characteristics and can be elastically deformed. The insulating layer 51 is formed, for example, of soft synthetic resin or rubber. A separation hole 51*a* is formed in a radially center portion of the insulating layer 51. The separation hole 51*a* extends in the longitudinal direction of the insulating layer 51. The separation hole 51*a* has four separation recesses 51*b* to 51*e*, which form a cross in the cross section along the direction perpendicular to the longitudinal direction of the insulating layer 51 are arranged at equal angular intervals. The separation recesses 51*b* to 51*e* are connected at a radial center of the insulating layer 51 and extend radially outward. In the separation hole 51*a*, the four separation recesses 51*b* to 51*e* each extend helically along the longitudinal direction of the insulating layer 51.

Inside the insulating layer 51, first to fourth electrode wires 52*a* to 52*d* are supported by the insulating layer 51. The electrode wires 52*a* to 52*d* each include a flexible core electrode 53 and a cylindrical conductive coating layer 54. The core electrode 53 is formed by twining conductive fine lines, and coated by the conductive coating layer 54. The conductive coating layer 54 has conductivity and elasticity. Each of the electrode wires 52*a* to 52*d* is located between an adjacent pair of the separation recesses 51*b* to 51*e*, and extends helically along the separation recesses 51*b* to 51*e*. More than half the circumferential surface of each of the electrode wires 52*a* to 52*d* is embedded in the insulating layer 51.

A conductive sensor electrode 56 is provided on the outer circumference of the insulating layer 51. The sensor electrode 56 is cylindrical and coats the insulating layer 51 from one end to the other end in the longitudinal direction. For example, the sensor electrode 56 is formed to be cylindrical by winding metallic lines about the outer circumference of the insulating layer 51. The outer circumference of the sensor electrode 56 is coated by a cylindrical outer layer 57. The outer layer 57 is formed of insulating material and can be elastically deformed. The length of the outer layer 57 in the longitudinal direction is equal to the length of the insulating layer 51 in the longitudinal direction.

As shown in FIG. 2, the first electrode wire 52*a* and the third electrode wire 52*c* are electrically connected to each other at first ends in the longitudinal direction (the right ends as viewed in FIG. 3). The second electrode wire 52*b* and the fourth electrode wire 52*d* are electrically connected to each other at first ends in the longitudinal direction (the right ends as viewed in FIG. 2). The third electrode wire 52*c* and the fourth electrode wire 52*d* are electrically connected to each other at a second end in the longitudinal direction (the left end as viewed in FIG. 2) with a resistor 58 in between. A second end of the second electrode wire 52*b* (the left end as viewed in FIG. 2) is connected to a ground GND, or grounded to the vehicle body 3. A second end of the first electrode wire 52*a* (the left end as viewed in FIG. 2) is electrically connected to the ON-OFF detector 43. The first electrode wire 52*a* receives electricity through the control circuit device 91 and the ON-OFF detector 43.

As shown in FIG. 3A, the sensor support member 46 is formed by integrally forming an attaching portion 61 for fixing the sensor support member 46 to the rear door panel 5 and a holding portion 62 for holding the sensor body 45.

The attaching portion 61 has an attaching portion main body 65, which is made of elastic insulating resin material. A reinforcing member 63 and a guard electrode 64 are embedded in the main body 65. The reinforcing member 63 is formed of conductive metal plate. The guard electrode 64 is formed of conductive rubber. The insulating resin material forming the main body 65 includes rubber and elastomer. In the present embodiment, the main body 65 is formed of elastomer.

Figure 4:
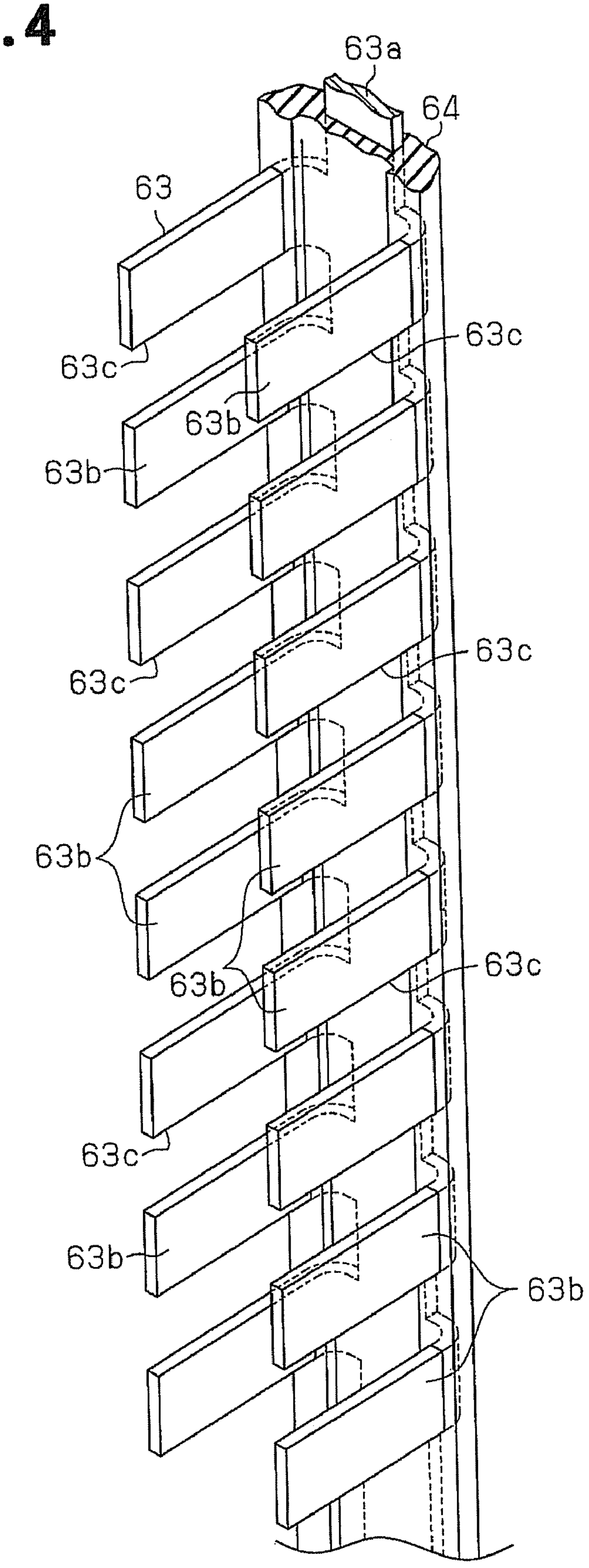
FIG. 4 is a perspective view illustrating a reinforcing member integrally formed with a guard electrode in the power sliding door apparatus shown in FIG. 1.

The reinforcing member 63 is used for reinforcing the sensor support member 46. As shown in FIG. 4, the reinforcing member 63 includes a belt-like reinforcing core 63*a* and a plurality of reinforcing extensions 63*b*, which are arranged along the longitudinal direction of the reinforcing core 63*a*. The reinforcing extensions 63*b* extend from both of the widthwise sides of the reinforcing core 63*a*. The length of the reinforcing core 63*a* in the longitudinal direction is substantially equal to the length of the sensor body 45 (refer to FIG. 3A) in the axial direction. The reinforcing extensions 63*b* are formed at equal intervals along the longitudinal direction of the reinforcing core 63*a*. The width of a gap 63*c* between each pair of the reinforcing extensions 63*b* that are adjacent to each other in the longitudinal direction of the reinforcing core 63*a* (the width in the same direction as the longitudinal direction of the reinforcing core 63*a*) is substantially equal to the width of each reinforcing extension 63*b* (the width in the same direction as the longitudinal direction of the reinforcing core 63*a*) in the present embodiment. The reinforcing extensions 63*b* are bent at proximal portions such that the distal ends of the reinforcing extensions 63*b* on one side in the widthwise direction of the reinforcing core 63*a* and the ends of the reinforcing extensions 63*b* on the other side approach each other. When viewed from longitudinal direction of the reinforcing core 63*a*, each reinforcing extension 63*b* is substantially L-shaped. Since the reinforcing extensions 63*b* are bent at proximal portions, the reinforcing member 63 is shaped like a channel when viewed in the longitudinal direction.

The guard electrode 64 is arranged to coat the reinforcing core 63*a* and the proximal portions of the reinforcing extensions 63*b*, so as to be integrated with the reinforcing member 63. Thus, the outer surface of the reinforcing core 63*a* and the outer surface of the proximal portions of the reinforcing extensions 63*b* are coated with the guard electrode 64, and a proximal part of a gap 63*c* between each adjacent pair of the reinforcing extensions 63*b*, which are arranged in the longitudinal direction of the reinforcing core 63*a*, is filled with the conductive resin forming the guard electrode 64. The guard electrode 64 closely contacts the reinforcing member 63.

As shown in FIG. 3A, the reinforcing member 63 is embedded in the main body 65 of the attaching portion 61. The main body 65 has a channel-like cross section perpendicular to the longitudinal direction of the sensor support member 46. The main body 65 has an attaching groove 65*a* between the reinforcing extensions 63*b* facing each other through the reinforcing core 63*a*. The attaching groove 65*a* opens at an opposite side to the reinforcing core 63*a*. The attaching groove 65*a* extends along the longitudinal direction of the sensor support member 46 from one end to the other end of the attaching portion 61. Two pairs of pressing projections 65*b* project toward each other from opposite inner surfaces of the attaching groove 65*a*. Each pressing projection 65*b* is integrally formed with the main body 65.

The cylindrical holding portion 62 is formed of the same insulating resin material as the main body 65 and has elasticity. The holding portion 62 is formed integrally with the attaching portion 61 and is located on the side opposite to the attaching groove 65*a* when viewed along the axial direction. The length of the holding portion 62 in the axial direction is substantially equal to the length of the sensor body 45 in the axial direction. A retaining hole 62*a* is formed in the holding portion 62. The retaining hole 62*a* extends in the axial direction of the holding portion 62. The inner diameter of the retaining hole 62*a* is slightly greater than the outer diameter of the sensor body 45. The sensor body 45 is inserted into the retaining hole 62*a*.

The sensor support member 46 is fixed to the front end 5*a* of the rear door panel 5 with the sensor body 45 inserted in the retaining hole 62*a*. The rear door panel 5 includes an inner plate 71 located on the inner side of the vehicle and an outer plate 72 located on the outer side of the vehicle. At the front end of the inner plate 71 (at an end in the advancing direction of the vehicle 2), a fixed portion 71*a* and an extended portion 71*b* are formed. The fixed portion 71*a* extends substantially parallel with the widthwise direction of the vehicle, and the extended portion 71*b* extends from the outer end of the fixed portion 71*a* toward the front of the vehicle 2. The distal end of the extended portion 71*b* is covered by the outer plate 72. A bracket 73 having a press-fitted portion 73*a* extending toward the front of the vehicle 2 is fixed to a front surface of the fixed portion 71*a* in the vehicle 2. The bracket 73 extends along the up-down direction of the vehicle 2. The bracket 73 is formed such that its length in the longitudinal direction (the same as the up-down direction of the vehicle 2) is substantially the same as the length of the sensor support member 46 in the longitudinal direction. By press fitting the press-fitted portion 73*a* into the attaching groove 65*a*, the sensor support member 46 is fixed to the bracket 73. As a result, the sensor body 45 is fixed to the front end 5*a* of the rear door panel 5. In a state where the sensor support member 46 is fixed to the front end 5*a* of the rear door panel 5, the guard electrode 64 is located rearward of the sensor body 45.

As shown in FIG. 2, the guard electrode 64 is electrically connected to the sensor electrode 56 through a buffer amplifier 81, and the reinforcing member 63 is grounded. That is, the guard electrode 64 is grounded through the reinforcing member 63. The guard electrode 64 is maintained to the same voltage as the sensor electrode 56 by the buffer amplifier 81.

The ON-OFF detector 43, together with the sensor body 45, forms a touch type pressure sensitive sensor that detects an object (not shown) present between the rear door panel 5 and the edge of the door opening 4 when the rear door panel 5 is being closed. The ON-OFF detector 43 is arranged in the rear door panel 5 and is connected to the ground GND.

Figure 3C:
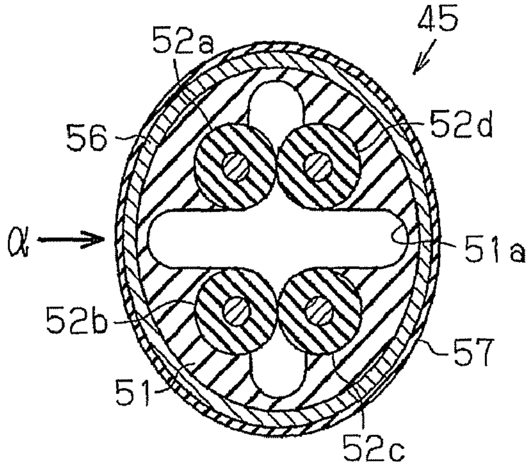

As shown in FIGS. 2 and 3B, when no pressing force is applied to the sensor body 45, current supplied to the first electrode wire 52*a* flows through the third electrode wire 52*c*, the resistor 58, and the fourth electrode wire 52*d* in this order. On the other hand, when a pressing force is applied to the sensor body 45 from the direction of arrow a as shown in FIGS. 2 and 3C, the outer layer 57, the sensor electrode 56, and the insulating layer 51 are elastically deformed. As a result, one of the first electrode wire 52*a* and the third electrode wire 52*c* contacts and is electrically connected to one of the second electrode wire 52*b* and the fourth electrode wire 52*d*. Then, the current supplied to the first electrode wire 52*a* flows to the fourth electrode wire 52*d* without flowing through the resistor 58. Accordingly, the voltage value between the first electrode wire 52*a* and the ground GND when no pressing force is applied to the sensor body 45 is different from that when a pressing force is applied to the sensor body 45. The ON-OFF detector 43 detects changes in the voltage value between the first electrode wire 52*a* and the ground GND, and outputs a signal indicating a change in the voltage value, that is, an object contact signal, to the control circuit device 91. For example, the ON-OFF detector 43 has a threshold value that has been determined based on the voltage value between the first electrode wire 52*a* and the ground GND in a state where no pressing force is being applied to the sensor body 45. When the voltage value between the first electrode wire 52*a* and the ground GND exceeds the threshold value, the ON-OFF detector 43 outputs an object contact signal. When the pressing force applied to the sensor body 45 is removed, the shapes of the outer layer 57, the sensor electrode 56, and the insulating layer 51 are restored, and the shapes of the first to fourth electrode wires 52*a* to 52*d* are restored.

As shown in FIG. 2, the capacitance detecting circuit 44 is electrically connected to the sensor electrode 56. The capacitance detecting circuit 44 and the sensor body 45 form a capacitance type proximity sensor that detects without any physical contact the presence of a conductive object existing between the rear door panel 5 and the edge of the door opening 4 when the rear door panel 5 is being closed.

The capacitance detecting circuit 44 is arranged in the rear door panel 5. The capacitance detecting circuit 44 is electrically connected to the control circuit device 91. The capacitance detecting circuit 44 detects the capacitance between the sensor electrode 56 and an object in the proximity of the sensor electrode 56 (for example, the ground surface, a part of a human body, and a conductive foreign object). That is, based on an electrical signal that is sent from the sensor electrode 56 of the sensor body 45 and indicates the distance between the sensor electrode 56 and an object, the capacitance detecting circuit 44 detects the capacitance of the sensor electrode 56. The capacitance detecting circuit 44 outputs the detected capacitance of the sensor electrode 56 (detection value) to the control circuit device 91.

The power sliding door apparatus 1 in the present embodiment is controlled by the control circuit device 91. The control circuit device 91 functions as a microcomputer that includes a ROM (Read Only Memory) and a RAM (Random Access Memory). The control circuit device 91 is located, for example, in the vicinity of the slide motor 26, and supplied with drive electricity from a battery 92 of the vehicle 2. The control circuit device 91 controls the slide actuator 25 and the closure actuator 28 based on various types of signals sent from the half latch detecting portion, the position detector 27, the operation switch 31, the ON-OFF detector 43, and the capacitance detecting circuit 44.

The control circuit device 91 includes a determination circuit 91*a*. The determination circuit 91*a* has a threshold value for determining that a conductive object is in the proximity of the sensor portion 42. When the rear door panel 5 is being closed, the determination circuit 91*a* compares the threshold value output by the capacitance detecting circuit 44 with the threshold value. Based on the comparison result, the determination circuit 91*a* determines whether there is an object in the proximity of the sensor portion 42, that is, whether there is a conductive object in the vicinity of the front end 5*a* of the rear door panel 5. In the present embodiment, when the detection value output from the capacitance detecting circuit 44 is greater than the threshold, the determination circuit 91*a* determines that there is an object in the proximity of the sensor portion 42, and outputs an object proximity signal indicating that the object is in the proximity of the sensor portion 42. The threshold value is set based on the capacitance that is actually detected by the capacitance detecting circuit 44 when the rear door panel 5 is being closed with no object between the edge of the door opening 4 and the front end 5*a* of the rear door panel 5.

The operation of the power sliding door apparatus 1 will now be described.

When receiving an open signal from the operation switch 31, the control circuit device 91 outputs a drive signal to the slide motor 26 to open the rear door panel 5. When the rear door panel 5 reaches a position where the door opening 4 is fully open, the control circuit device 91 stops the slide motor 26. Based on the rotation detection signals sent from the position detector 27, the control circuit device 91 monitors the position of the rear door panel 5.

When receiving a close signal from the operation switch 31, the control circuit device 91 activates the ON-OFF detector 43 and the capacitance detecting circuit 44, and controls the slide motor 26 to close the rear door panel 5. When receiving a half latch detection signal from the half latch detecting portion while the rear door panel 5 is being closed, the control circuit device 91 controls the closure motor 29 such that the rear door panel 5 is moved to a position where the rear door panel 5 can be locked by the lock mechanism. When the rear door panel 5 closes the door opening 4, the control circuit device 91 stops the slide motor 26 and the closure motor 29.

If a conductive object exists between the door opening 4 and the rear door panel 5 when the rear door panel 5 is being closed, the distance between the sensor portion 42 (the sensor electrode 56) and the object decreases as the rear door panel 5 moves. Accordingly, the detection value output from the capacitance detecting circuit 44 exceeds the threshold value output from the determination circuit 91*a*. When the detection value output by the capacitance detecting circuit 44 exceeds the threshold value, the determination circuit 91*a* outputs an object proximity signal. When the determination circuit 91*a* outputs an object proximity signal, the control circuit device 91 reverses the slide motor 26, thereby opening the rear door panel 5 by a predetermined amount.

The voltage of the guard electrode 64 located in the sensor support member 46 supporting the sensor body 45 is maintained at the same level as that of the sensor electrode 56 by the buffer amplifier 81. Therefore, the capacitance detected by using the sensor electrode 56 is prevented from being influenced by disturbance. Also, when a conductive object approaches the sensor body 45, the capacitance of the sensor electrode 56 is prevented from being changed due to the approach of the object since the voltage of the guard electrode 64 is maintained at the same level as that of the sensor electrode 56. That is, when there is a conductive object approaches the sensor body 45 from behind in the vehicle, the guard electrode 64 prevents the capacitance detected by the capacitance detecting circuit 44 from being changed. Therefore, objects that are unlikely to get caught between the rear door panel 5 and the edge of the door opening 4 are not detected. On the other hand, when a conductive object in front of the rear door panel 5, that is, an object that is likely to get caught between the rear door panel 5 and the edge of the door opening 4, approaches the sensor body 45, the capacitance detected by the capacitance detecting circuit 44 is changed, so that the object is detected.

When receiving an object contact signal from the ON-OFF detector 43 while the rear door panel 5 is being closed, the control circuit device 91 reverses the slide motor 26, thereby opening the rear door panel 5 by a predetermined amount.

The method for manufacturing the sensor support member 46 will now be described. The method for manufacturing the sensor support member 46 of the present embodiment includes a step for forming a reinforcing plate, a step for forming a guard electrode, a step for bending, and a step for embedding.

Figure 5A:
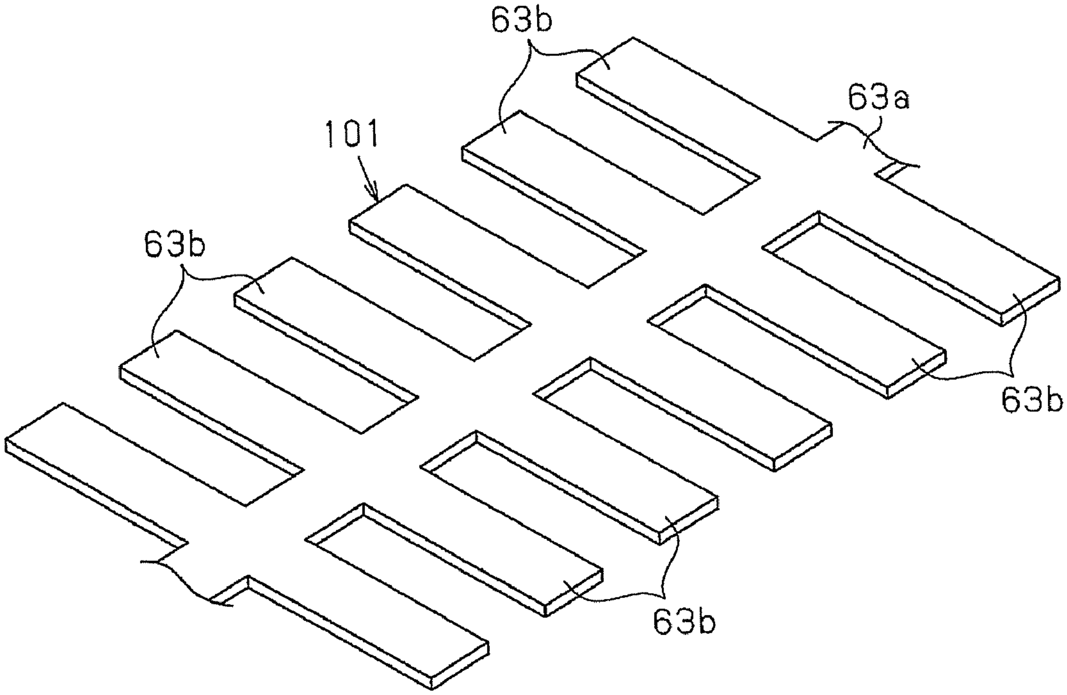
FIGS. 5A and 5B are diagrams for explaining a method for manufacturing a sensor support member according to the embodiment of the present invention.

First, in the reinforcing plate forming step, a reinforcing plate 101, which will be formed into the reinforcing member 63 through the bending step discussed below, is formed as shown in FIG. 5A. The reinforcing plate 101 includes a belt-like reinforcing core 63*a* and a plurality of reinforcing extensions 63*b*, which are arranged at equal intervals along the longitudinal direction of the reinforcing core 63*a*. The reinforcing extensions 63*b* extend in the widthwise direction of the reinforcing core 63*a* from both of the widthwise sides of the reinforcing core 63*a*. That is, each reinforcing extension 63*b* extends in a direction perpendicular to the longitudinal direction of the reinforcing core 63*a*. The reinforcing plate 101 is formed as a flat plate so that the reinforcing core 63*a* and the reinforcing extensions 63*b* are in the same plane. The reinforcing plate 101 is formed by punching a conductive metal plate through press work.

Figure 5B:
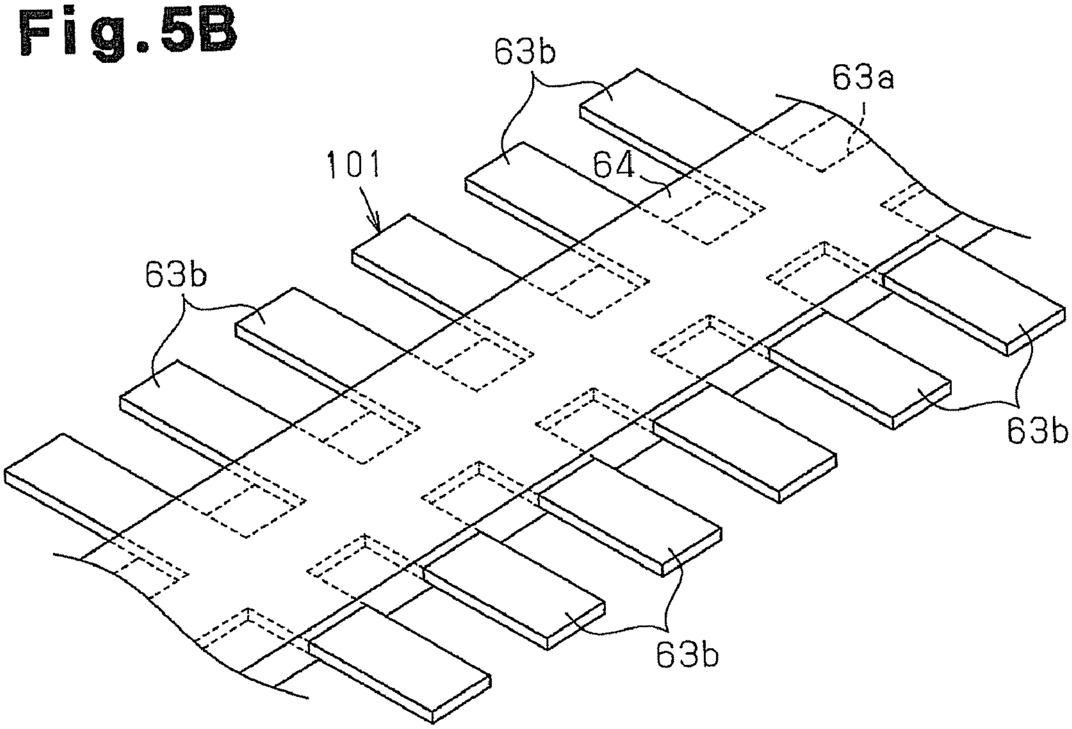

Next, in the guard electrode forming step, the guard electrode 64 is formed integrally with the reinforcing plate 101. As shown in FIG. 5B, conductive resin material in a liquid state is applied to the reinforcing plate 101 such that the reinforcing core 63*a* and the proximal portions of the reinforcing extensions 63*b* are embedded. The conductive resin material is then hardened to form the guard electrode 64. In the present embodiment, the guard electrode 64 is formed by extrusion molding, and the conductive resin material of the guard electrode 64 is molded simultaneously when being applied to the reinforcing plate 101. The guard electrode 64 integrated with the reinforcing plate 101 coats the reinforcing core 63*a* and the proximal portions of the reinforcing extensions 63*b*, and fills a proximal part of the gap 63*c* between each adjacent pair of the reinforcing extensions 63*b*, which are arranged in the longitudinal direction of the reinforcing core 63*a*.

Subsequently, the reinforcing extensions 63*b* of the reinforcing plate 101 is bent in the bending step. The reinforcing extensions 63*b* are bent at proximal portions such that the distal ends of the reinforcing extensions 63*b* on one side in the widthwise direction of the reinforcing core 63*a* and the ends of the reinforcing extensions 63*b* on the other side approach each other. Therefore, when viewed from longitudinal direction of the reinforcing core 63*a*, each reinforcing extension 63*b* is substantially L-shaped. As a result, the reinforcing member 63 is shaped like a channel when viewed in the longitudinal direction. That is, the proximal portions of the reinforcing extensions 63*b* are bent in the bending step, so that the reinforcing plate 101 is formed into the reinforcing member 63 having a shape conforming to the attaching portion 61.

Next, in the embedding step, the reinforcing member 63 having the guard electrode 64 is embedded in the main body 65. In the embedding step, insulating resin material is subjected to extrusion molding to form the main body 65 and the holding portion 62. The extrusion molding is performed while embedding the reinforcing member 63, with which the guard electrode 64 is integrally formed, in the main body 65. The sensor support member 46, which is completed through the embedding step, is fixed to the front end 5*a* of the rear door panel 5 after the sensor body 45 is inserted in the retaining hole 62*a*.

The present embodiment has the following advantages.

(1) The guard electrode 64 made of conductive rubber is integrally formed with the reinforcing member 63, which reinforces the sensor support member 46. The attaching portion 61 of the sensor support member 46 is formed by embedding the reinforcing member 63 integrally formed with the guard electrode 64 in the main body 65. Therefore, compared to the case where a guard electrode made of conductive rubber and insulating resin material forming a sensor supporting member are molded simultaneously to form the sensor support member, the sensor support member 46 is more easily formed. Since the guard electrode 64 is integrally formed with the reinforcing member 63 before a portion of the sensor support member 46 that is made of insulating resin material (that is, the holding portion 62 and the main body 65) are formed, the guard electrode 64 is firmly secured to the reinforcing member 63 compared to the case where a portion of a sensor support member that is made of insulating resin material and a guard electrode are formed integrally. Further, since the guard electrode 64 and the reinforcing member 63 are embedded in the insulating resin material forming the sensor support member 46, the guard electrode 64 and the reinforcing member 63 are not inadvertently short-circuited.

(2) In the embedding step, the reinforcing member 63 integrally formed with the guard electrode 64 is embedded in the main body 65, which is made of insulating resin material forming the attaching portion 61. Since the reinforcing member 63 reinforces the attaching portion 61, the manufactured sensor support member 46 is firmly secured to the front end 5*a* of the rear door panel 5.

(3) In the guard electrode forming step, the guard electrode 64 is formed integrally with the flat reinforcing plate 101. This facilitates the formation of the guard electrode 64. Since the reinforcing plate 101 is formed as a flat plate, the apparatus for forming the guard electrode 64 is unlikely to be complicated. Thus, the manufacturing costs can be reduced.

(4) Since the guard electrode 64 is integrally formed with the reinforcing member 63 formed by a conductive plate, the current through the guard electrode 64 is stable compared to the case where a guard electrode made of conductive rubber is formed separately from the reinforcing member 63. If only the reinforcing member 63 is used as a guard electrode, that is, if the sensor support member 46 has no guard electrode made of conductive rubber, the gap 63*c* between each adjacent pair of the reinforcing extensions 63*b* needs to be narrow to reduce the part that does not face the door panel 5, so that the guard electrode sufficiently exerts its function. However, in the present embodiment, since the guard electrode 64 made of conductive rubber is integrally formed with the reinforcing member 63, the capacitance detected by the capacitance detecting circuit 44 is effectively inhibited from being unnecessarily changed by disturbance regardless of the shape of the reinforcing member 63.

(5) The reinforcing member 63 includes the belt-like reinforcing core 63*a* and the reinforcing extensions 63*b*, which are arranged along the longitudinal direction of the reinforcing core 63*a*. The reinforcing extensions 63*b* extend from both of the widthwise sides of the reinforcing core 63*a*. Since the cross-sectional shape of the reinforcing member 63 is not constant along the longitudinal direction, the reinforcing member 63 is easy to bend in the longitudinal direction of the reinforcing core compared to a reinforcing member having a constant cross-sectional shape along the longitudinal direction of the reinforcing core. Therefore, the sensor support member 46 having the reinforcing member 63 is easily attached to the front end 5*a* of the rear door panel 5 even if the front end 5*a* is curved. Also, since the reinforcing member 63 is formed by bending the reinforcing plate 101, which is formed by pressing, the reinforcing member 63 is easy to form.

(6) The guard electrode 64 is formed integrally with the reinforcing member 63 so as to coat a part of the reinforcing member 63 (in the present embodiment, the reinforcing core 63*a* and the proximal portions of the reinforcing extensions 63*b*). Thus, even if the reinforcing member 63 is curved, the guard electrode 64 hardly comes off the reinforcing member 63. Therefore, even if the sensor support member 46 is fixed to the front end 5*a* of the rear door panel 5 in a curved state, the current through the guard electrode 64 is prevented from being unstable.

The above embodiment of the present invention may be modified as follows.

In the embedding step of the above embodiment, after the reinforcing member 63 integrally formed with the guard electrode 64 is embedded in the main body 65 to complete the sensor support member 46, the sensor body 45 is inserted in the retaining hole 62*a* of the holding portion 62. However, extrusion molding may be performed such that the sensor body 45 is retained in the holding portion 62 at the same time as the holding portion 62 and the main body 65 are formed of insulating resin material. If the embedding of the reinforcing member 63 in the main body 65 and the holding of the sensor body 45 by the holding portion 62 are performed simultaneously, the number of steps is reduced, which improves the productivity. Also, the space between the guard electrode 64 and the sensor body 45 is easily made constant along the longitudinal direction the sensor support member 46.

In the guard electrode forming step of the above embodiment, after the guard electrode 64 is formed integrally with the flat reinforcing plate 101, the bending step is performed to bending the reinforcing extensions 63*b* to complete the reinforcing member 63. However, the reinforcing extensions 63*b* may be bent to complete the reinforcing member 63 before the guard electrode 64 is formed, and thereafter, the guard electrode forming step may be performed to form the guard electrode 64 integrally with the reinforcing member 63.

In the above embodiment, the reinforcing plate 101 is formed by pressing. However, the reinforcing plate 101 may be formed by a method other than pressing.

In the above embodiment, the guard electrode 64 is provided in the attaching portion 61. However, the guard electrode 64 may be provided on the holding portion 62 as long as it is integrally formed with the reinforcing member 63. The reinforcing member 63 is embedded in the main body 65, which forms the attaching portion 61. However, the reinforcing member 63 may be embedded in other part as long as it is embedded in the insulating resin material forming the sensor support member 46. For example, the reinforcing member 63 may be embedded in the holding portion 62.

In the above embodiment, the sensor support member 46 has the attaching portion 61 and the holding portion 62, which are formed integrally by extrusion molding. However, the attaching portion 61 and the holding portion 62 may be separately formed, and then the holding portion 62 may be fixed to the attaching portion 61 with adhesive to form the sensor support member 46. The sensor support member 46 may be formed solely by the attaching portion 61. In this case, the sensor body 45 is directly fixed to the attaching portion 61 with adhesive.

Figure 6:
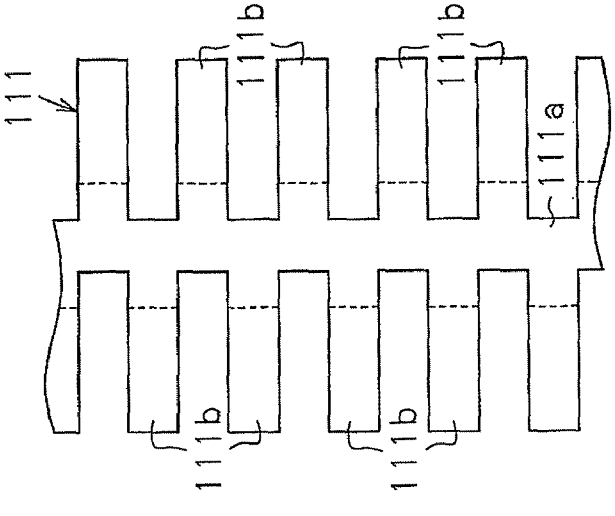
FIG. 6 is a plan view illustrating a reinforcing member of a sensor support member according to another embodiment.

The shapes of the reinforcing member 63 and the reinforcing plate 101 are not limited to those in the above embodiment. For example, as shown in FIG. 6, a reinforcing member 111 includes a belt-like reinforcing core 111*a* like the reinforcing core 63*a* of the above embodiment, and a plurality of reinforcing extensions 111*b*, which are arranged along the longitudinal direction of the reinforcing core 111*a*. The reinforcing extensions 111*b* extend in the widthwise direction (the transverse direction) of the reinforcing core 111*a* from both of the widthwise sides (in the transverse direction) of the reinforcing core 111*a*. Each reinforcing extension 111*b* is formed like a rectangular plate that extends in a direction perpendicular to the longitudinal direction of the reinforcing core 111*a*. The reinforcing extensions 111*b* are formed at equal intervals along the longitudinal direction of the reinforcing core 111*a*. The reinforcing extensions 111*b* on one side in the widthwise direction of the reinforcing core 111*a* are each located between two of the reinforcing extensions 111*b* on the other side in the widthwise direction of the reinforcing core 111*a*. The thus configured reinforcing plate 111 is bent at proximal portions of the reinforcing extensions 111*b* (at parts shown by broken lines in FIG. 6).

Figure 7:
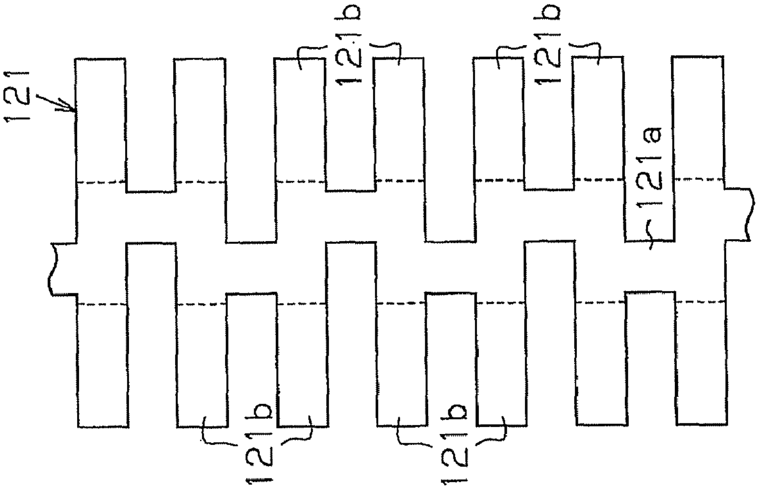
FIG. 7 is a plan view illustrating a reinforcing member of a sensor support member according to another embodiment.

In a reinforcing plate 121 shown in FIG. 7, a reinforcing core 121*a* is shaped such that, when viewed in the direction along the thickness, rectangular recesses and projections are repetitively formed along the longitudinal direction of the reinforcing core 121*a*. The reinforcing extensions 121*b* are formed like rectangular plates that extend in the widthwise direction of the reinforcing core 121*a* from both of the widthwise sides of the reinforcing core 121*a*. The reinforcing extensions 121*b* are integrally formed with the reinforcing core 121*a*. The flat-plate like reinforcing plate 121 is bent at proximal portions of the reinforcing extensions 121*b* (at parts shown by broken lines in FIG. 7).

Figure 8:
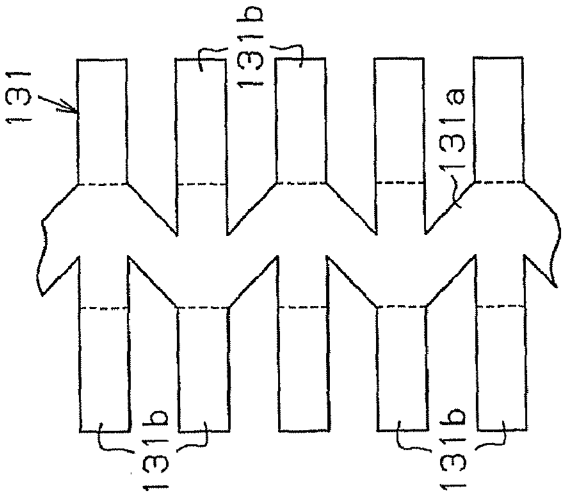
FIG. 8 is a plan view illustrating a reinforcing member of a sensor support member according to another embodiment.

In a reinforcing plate 131 shown in FIG. 8, a reinforcing core 131*a* is shaped so as to extend zigzag in the longitudinal direction when viewed in the direction along the thickness. The reinforcing extensions 131*b* are formed like rectangular plates that extend in the widthwise direction of the reinforcing core 131*a* from both of the widthwise sides of the reinforcing core 131*a*. The reinforcing extensions 131*b* are integrally formed with the reinforcing core 131*a*. Each reinforcing extension 131*b* extends from a bent portion of the reinforcing core 131*a*. The flat-plate like reinforcing plate 131 is bent at proximal portions of the reinforcing extensions 131*b* (at parts shown by broken lines in FIG. 8).

Figure 9C:
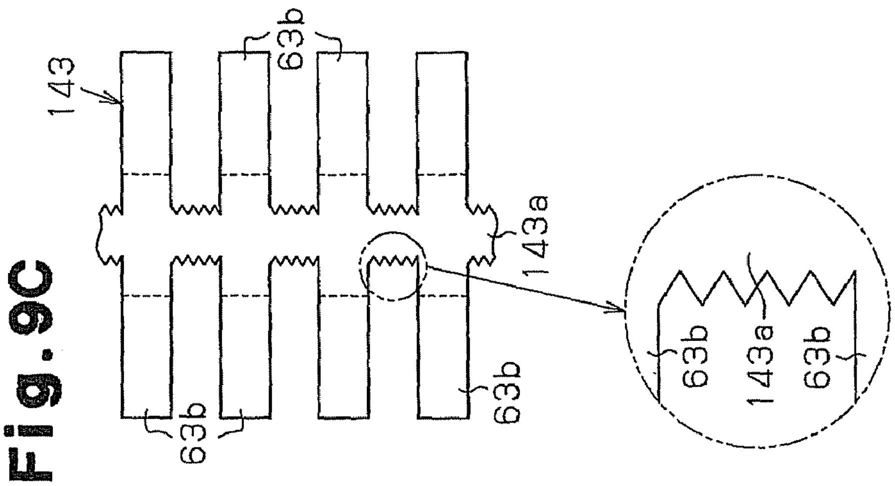
FIGS. 9A to 9C are plan views illustrating reinforcing members of sensor support members according to other embodiments.
Figure 9A:
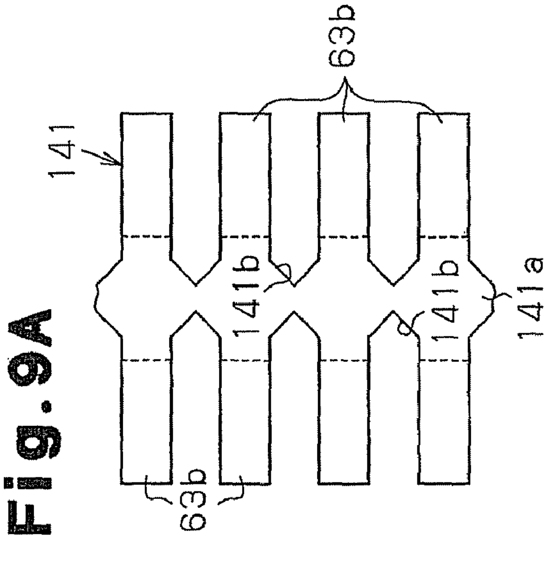
Figure 9B:
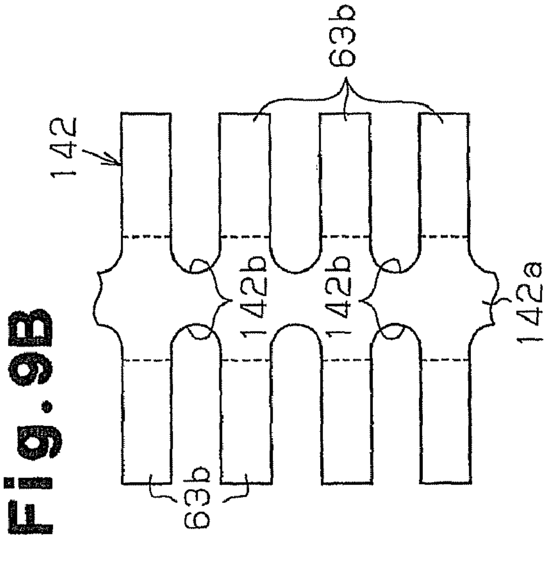

A reinforcing plate 141 shown in FIG. 9A has a reinforcing core 141*a* and a plurality of recesses 141*b* on both sides of the reinforcing core 141*a* in the widthwise direction. Each recess 141*b* is dented toward the center in the widthwise direction of the reinforcing core 141*a*. The recesses 141*b* are formed at equal intervals along the longitudinal direction of the reinforcing core 141*a*. The recesses 141*b* are formed between the reinforcing extensions 63*b*. When viewed from the direction of the thickness of the reinforcing plate 141, each recess 141*b* has a triangular shape. A reinforcing plate 142 shown in FIG. 9B has a reinforcing core 142*a* and a plurality of recesses 142*b* on both sides of the reinforcing core 142*a* in the widthwise direction. When viewed from the direction of the thickness of the reinforcing plate 142, each recess 142*b* has an arcuate shape. The recesses 141*b* are formed between the reinforcing extensions 63*b*. A reinforcing plate 143 shown in FIG. 9C has a reinforcing core 143*a*, of which each side in the widthwise direction is saw-toothed. These reinforcing plates 141 to 143 are bent at proximal portions of the reinforcing extensions 63*b* (at parts shown by broken lines in the drawings).

Figure 10:
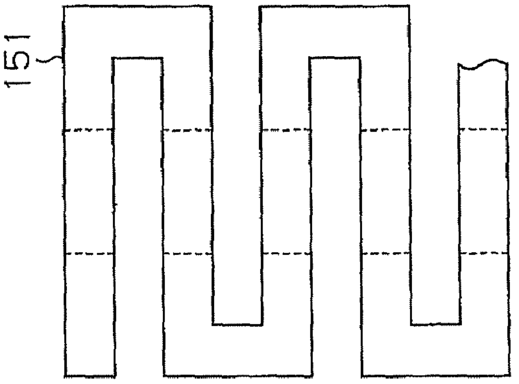
FIG. 10 is a plan view illustrating a reinforcing member of a sensor support member according to another embodiment.

A reinforcing plate 151 shown in FIG. 10 extends in a rectangular meander line along the longitudinal line when viewed in the direction of the thickness. The reinforcing plate 151 is bent at two parts in the widthwise direction (at parts shown by broken lines in FIG. 10) along the longitudinal direction.

Figure 11A:
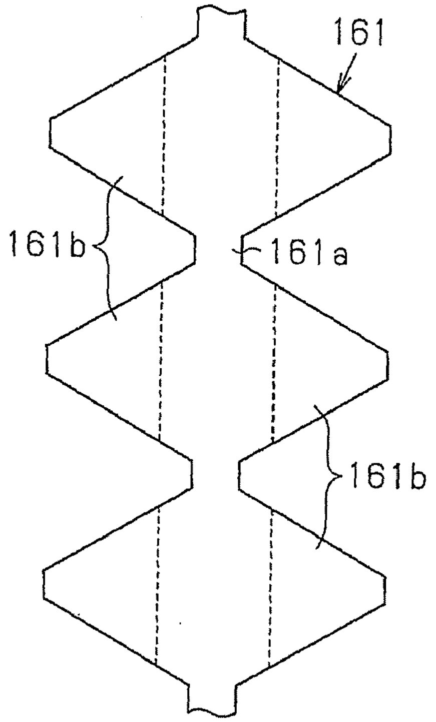
FIGS. 11A and 11B are plan views illustrating reinforcing members of sensor support members according to other embodiments.
Figure 11B:
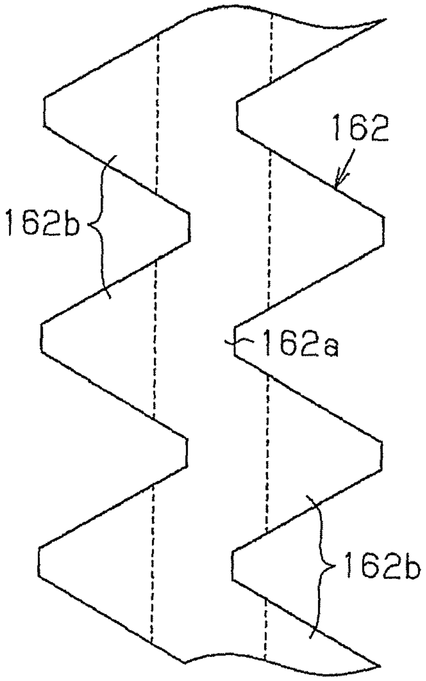

A reinforcing plate 161 shown in FIG. 11A is different from the reinforcing plate 101 (the reinforcing member 63) of the above embodiment in the shape of reinforcing extensions. Reinforcing extensions 161*b* of the reinforcing plate 161 extend in the widthwise direction of a reinforcing core 161*a* from both of the widthwise sides of the reinforcing core 161*a*. Each reinforcing extension 161*b* is shaped as a trapezoid, the width of which decreases from the proximal end toward the distal end. Also, the reinforcing extensions 161*b* are arranged at equal intervals along the longitudinal direction of the reinforcing core 161*a*. In a reinforcing plate 162 shown in FIG. 11B, trapezoidal reinforcing extensions 162*b* on one side in the widthwise direction of a reinforcing core 162*a* are each located between two of trapezoidal reinforcing extensions 162*b* on the other side in the widthwise direction of the reinforcing core 162*a*. These reinforcing plates 161, 162 are bent at proximal portions of the reinforcing extensions 161*b*, 162*b* (at parts shown by broken lines in FIGS. 11A and 11B). The shape of the reinforcing extensions is not limited to trapezoidal, but may be triangular, polygonal, or semicircular. Also, the reinforcing extensions do not need to be formed at equal internals along the longitudinal direction of the reinforcing core.

Figure 12A:
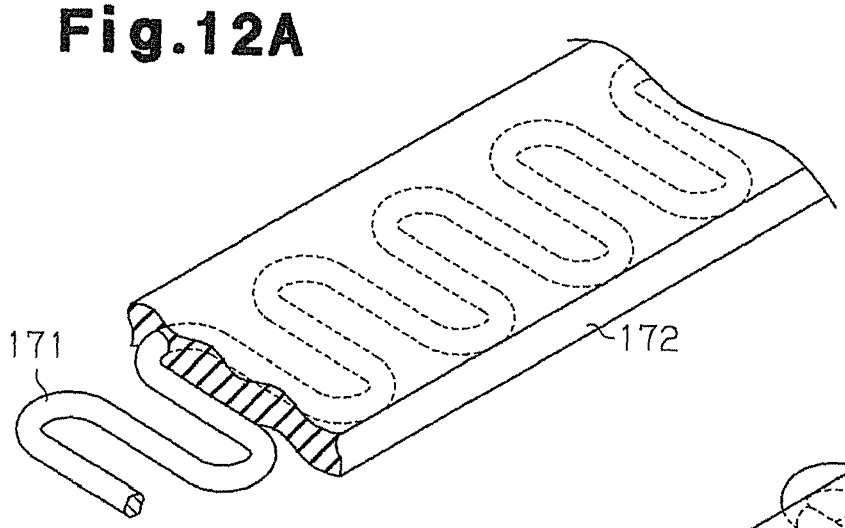
FIGS. 12A and 12B are perspective views illustrating reinforcing members of sensor support members according to other embodiments.
Figure 12B:
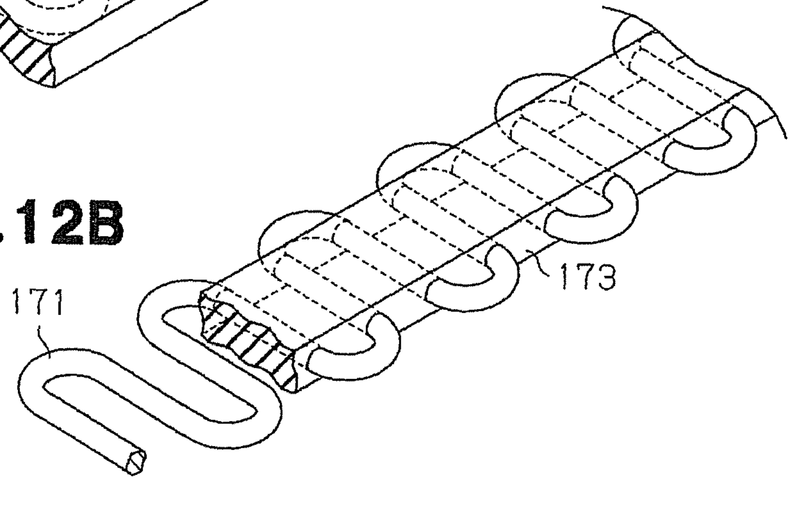

A reinforcing member 171 shown in FIG. 12A is formed by bending a metallic line (for example, wire) having circular cross section into a wavy shape. After the entire reinforcing member 171 is embedded in a guard electrode 172 made of conductive resin material, the reinforcing member 171 is bent along the longitudinal direction at two positions in the widthwise direction such that the reinforcing member 171 has a channel-like shape when viewed from the longitudinal direction. Although coatings the entire reinforcing member 171 in the example shown in FIG. 12A, the guard electrode 172 may partly coat the reinforcing member 171. For example, a guard electrode shown in FIG. 12B is integrally formed with the reinforcing member 171 so as to coat a center portion in the widthwise direction of the reinforcing member 171, and expose both widthwise ends of reinforcing member 171, that is, bent portions from the guard electrode 173. In the examples of FIGS. 12A and 12B, the reinforcing member 171 is formed by a metallic line. However, a reinforcing member formed by knitting a plurality of metallic lines may be used.

If a reinforcing core is used that does not have a straight form as the reinforcing core 63*a* of the above embodiment, but has a complicated shape as the reinforcing cores 121*a*, 131*a*, 141*a*, 142*a*, and 143*a* of the reinforcing plates 121, 131, 141, 142, and 143, the guard electrode 64 is less likely to come off the reinforcing member when the reinforcing member is curved. Further, the reinforcing member is easier to bend in the widthwise direction of the reinforcing core. Therefore, even in the case where the front end 5*a* of the rear door panel 5 is curved, the sensor support member 46 is easily attached to the door panel 5, and the guard electrode 64 is easily electrically stabilized.

In the sensor support member 46 of the above embodiment, the reinforcing core 63*a* of the reinforcing member 63 has a straight shape when viewed from the longitudinal direction, but may be curved in accordance with the outer surface of the sensor body 45.

In the embedding step of the above embodiment, the main body 65 and the holding portion 62 are formed by extrusion molding. However, the main body 65 and the holding portion 62 may be formed, for example, by injection molding.

Figure 13:
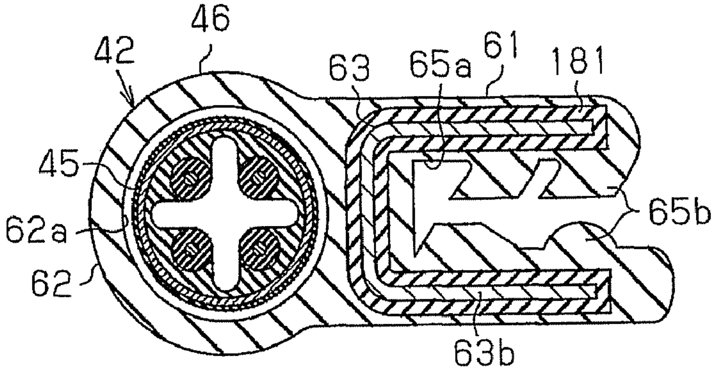
FIG. 13 is a cross-sectional view illustrating a sensor support member according to another embodiment.
Figure 14A:
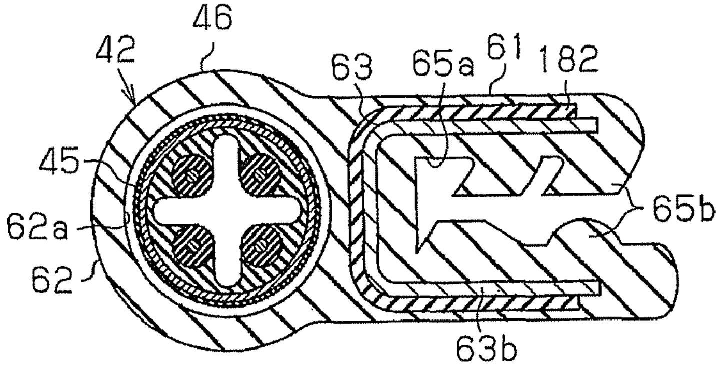
FIGS. 14A and 14B are cross-sectional views illustrating sensor support members according to other embodiments.
Figure 14B:
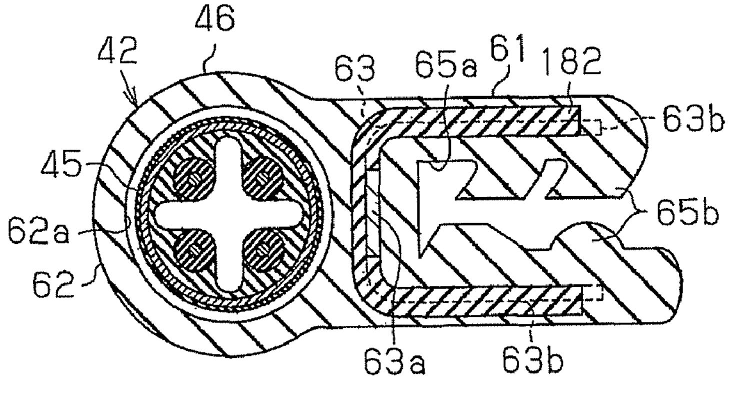
Figure 15A:
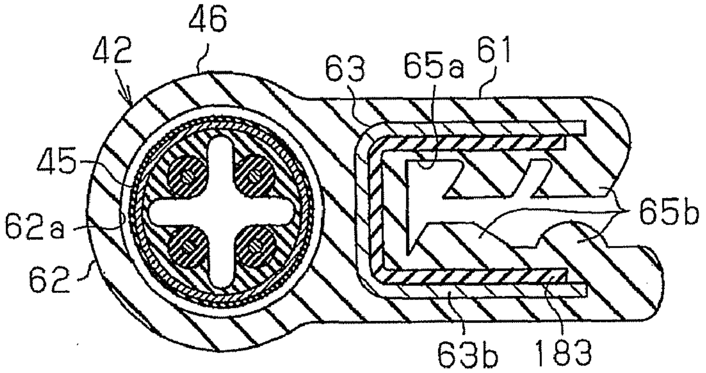
FIGS. 15A and 15B are cross-sectional views illustrating sensor support members according to other embodiments.
Figure 15B:
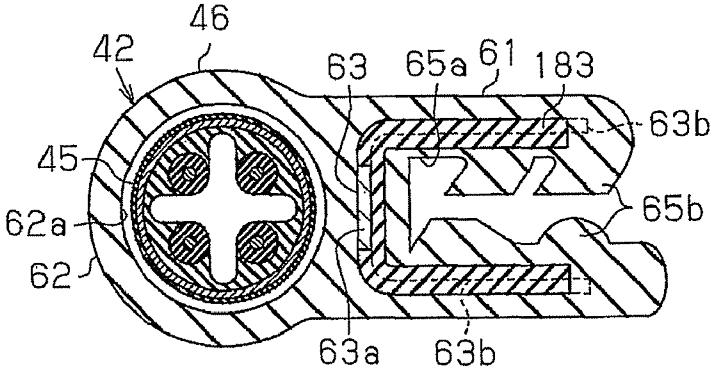

The position of the guard electrode 64 in relation to the reinforcing member 63 is not limited to that in the above embodiment. As long as the guard electrode 64 is attached to a side surface of the reinforcing member 63 and embed at least a part of the reinforcing member 63, the guard electrode 64 may be formed in any part of the reinforcing member 63. For example, a guard electrode 181 shown in FIG. 13 coats the entire surface of the reinforcing member 63. A guard electrode 182 shown in FIG. 14A coats the outer part of the surface of the reinforcing member 63. In the example shown in FIG. 14B, conductive rubber forming a guard electrode 182 fills spaces between each adjacent pair of the reinforcing extensions 63*b*, which are arranged along the longitudinal direction of the reinforcing member 63 (the direction perpendicular to the sheet of FIG. 14B). A guard electrode 183 shown in FIG. 15A coats the inner part of the surface of the reinforcing member 63. In the example shown in FIG. 15B, conductive rubber forming a guard electrode 183 fills spaces between each adjacent pair of the reinforcing extensions 63*b*, which are arranged along the longitudinal direction of the reinforcing member 63 (the direction perpendicular to the sheet of FIG. 15B). This structure has the same advantages as the above embodiment.

Figure 16:
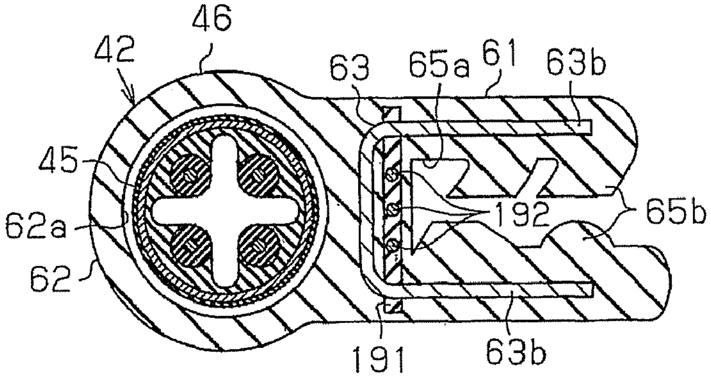
FIG. 16 is a cross-sectional view illustrating a sensor support member according to another embodiment.

The guard electrode 64 may have in it a carrier line formed of a conductive metallic line. In the example of FIG. 16, a guard electrode 191 made of conductive rubber is formed between the facing reinforcing extensions 63*b*, and a plurality of carrier lines 192 are embedded in the guard electrode 191. The carrier lines 192 extend in the longitudinal direction of guard electrode 191. The carrier lines 192 are embedded in the guard electrode 191 when the guard electrode 191 is integrally formed with the reinforcing member 63. The guard electrode 191 is therefore further electrically stabilized by the carrier lines 192.

In the guard electrode forming step, the guard electrode 64 may be formed by a method other by extrusion molding. The guard electrode 64 may be formed by, for example, injection molding.

In the above embodiment, the guard electrode 64 is formed of conductive rubber, but may be formed of material other than conductive rubber as long as it is formed of conductive resin material.

In the above embodiment, the capacitance detecting circuit 44 outputs the capacitance detected by using the sensor electrode 56. However, the capacitance detecting circuit 44 may output an amount of change of the capacitance of the sensor electrode 56. In this case, the determination circuit 91*a* determines whether there is an object in the proximity of the front end 5*a* of the rear door panel 5 based on the amount of change of capacitance output by the capacitance detecting circuit 44.

In the above embodiment, the guard electrode 64 is maintained to the same voltage as the sensor electrode 56 by the buffer amplifier 81. However, the guard electrode 64 may be maintained at the same voltage as the sensor electrode 56 by a structure other than the buffer amplifier 81. Alternatively, instead of being maintained at the same voltage as the sensor electrode 56, the guard electrode 64 may be maintained at a voltage of a constant ratio relative to the voltage of the sensor electrode 56.

In the above embodiment, the sensor portion 42 is fixed to the front end 5*a* of the rear door panel 5. However, the sensor portion 42 may be fixed to the edge of the door opening 4. In this case, the sensor portion 42 is fixed, for example, to a part of the edge of the door opening 4 that faces the front end 5*a* of the rear door panel 5 in the front-rear direction of the vehicle 2.

In the above embodiments, the present invention is applied to the power sliding door apparatus 1, in which the rear door panel 5 is slid in the front-rear direction of the vehicle 2, thereby opening or closing the door opening 4 provided on a side of the vehicle 2. However, the present invention may be applied to an opening and closing apparatus other than the power sliding door apparatus 1 as long as the apparatus uses the drive power of a drive motor to open and close an opening. For example, the present invention may be applied to a power window apparatus that raises and lowers a vehicle window glass using the drive power of a motor. In this case, the sensor portion 42 is arranged at the upper edge of the window glass or at an edge of an opening that is opened and closed by the window glass. For example, the present invention may be applied to an opening and closing apparatus that opens and closes a tail opening of a vehicle using a flip-up backdoor or to an opening and closing apparatus that opens and closes a train door.

What is claimed is:

1. A method for manufacturing a sensor support member, the sensor support member fixing a capacitance sensor, which detects a conductive object existing between an opening and closing body actuated by a drive portion and an edge of an opening, either to a closing end of the opening and closing body that is on the leading side when the opening and closing body is being closed or to the edge of the opening, wherein the capacitance sensor includes a conductive sensor electrode, wherein the capacitance sensor outputs a detection signal that corresponds to the capacitance between the sensor electrode and a conductive object located close to the sensor electrode, and wherein the sensor support member includes a guard electrode made of conductive resin material, the voltage of the guard electrode being maintained either at the same level as the voltage of the sensor electrode or at a level of a constant ratio relative to the voltage of the sensor electrode, the manufacturing method comprising:

providing the sensor supporting member with a holding portion, which holds the capacitance sensor, and an attaching portion, which fixes the holding portion either to the closing end or to the edge of the opening, the attaching portion having a main body made of insulating resin material;

forming a flat reinforcing plate from a conductive plate;

embedding at least a part of the reinforcing plate in the guard electrode, thereby integrating the reinforcing plate with the guard electrode;

bending the reinforcing plate integrated with the guard electrode, thereby forming a conductive reinforcing member; and embedding the reinforcing member in the main body after the reinforcing member is formed.

2. The manufacturing method according to claim 1, further comprising:

causing the holding portion to hold the capacitance sensor at the same time as the reinforcing member integrated with the guard electrode is embedded in the main body.

* * * * *